(12) United States Patent
Deschamp et al.

(10) Patent No.: US 7,831,855 B2
(45) Date of Patent: Nov. 9, 2010

(54) SYSTEM AND METHOD FOR GENERATING A RESET SIGNAL FOR SYNCHRONIZATION OF A SIGNAL

(75) Inventors: Joseph Deschamp, Schwenksville, PA (US); Carl R. Cochrane, West Chester, PA (US)

(73) Assignee: Harris Corporation, Melbourne, FL (US)

( * ) Notice: Subject to any disclaimer, the term of this patent is extended or adjusted under 35 U.S.C. 154(b) by 828 days.

(21) Appl. No.: 11/734,438

(22) Filed: Apr. 12, 2007

(65) Prior Publication Data

US 2008/0252345 A1 Oct. 16, 2008

(51) Int. Cl.
*G06F 1/04* (2006.01)
(52) U.S. Cl. ........................ 713/500; 713/400
(58) Field of Classification Search ................ 713/400, 713/500
See application file for complete search history.

(56) References Cited

U.S. PATENT DOCUMENTS

| | | | |
|---|---|---|---|
| 2,471,408 A | | 5/1949 | Busignies |
| 3,219,971 A | * | 11/1965 | Cole ........................... 367/42 |
| 4,415,927 A | | 11/1983 | Penney |
| 4,537,515 A | * | 8/1985 | Dinger et al. ................ 368/202 |
| 4,647,915 A | | 3/1987 | Shank et al. |
| 5,023,571 A | | 6/1991 | Fullmer et al. |
| 5,162,723 A | | 11/1992 | Marzalek et al. |
| 5,541,556 A | | 7/1996 | Francis |
| 5,768,321 A | | 6/1998 | Watanabe et al. |
| 5,789,954 A | | 8/1998 | Toeppen et al. |
| 5,838,749 A | | 11/1998 | Casper et al. |
| 5,914,592 A | | 6/1999 | Saito |
| 5,940,449 A | | 8/1999 | Kaaden et al. |
| 6,518,744 B1 | | 2/2003 | Tallman et al. |
| 7,061,287 B2 | * | 6/2006 | Jeon ............................ 327/149 |
| 7,072,804 B2 | | 7/2006 | Weller |
| 7,656,987 B2 | * | 2/2010 | Sareen ........................ 375/376 |
| 2004/0223577 A1 | | 11/2004 | Watanabe et al. |

OTHER PUBLICATIONS

European Search Report No. 08008033.6-2206, Mailed Aug. 13, 2008, Harris Corporation.

James A. Mears, "Use Video Standards for Eye-Opening Data Transmission: Mega-bits @ Many Meters", DesignCon 2000—Wireless and Broadband System Design Conference, (date unknown) 12 pages.

Article, "CLC016 Data Retiming PLL with Automatic Rate Selection", www.national.com, National Semiconductor Corporation, Jul. 2002, pp. 1-19.

Dave Guerrero, "Quality Assurance of High Definition Video Signals", Media Networks, the Reality! SMPTE Technical Conference and Exhibit, Oct. 20-23, 2004, 10 pages.

Dave Guerrero, "Application Note 60—High Definition SDI: Return Loss, Eye Pattern, and Jitter Measurements", Videotek A Zero Defects Company—Leitch, (date unknown) pp. 1-6.

* cited by examiner

*Primary Examiner*—Chun Cao
(74) *Attorney, Agent, or Firm*—Tarolli, Sundheim, Covell & Tummino LLP

(57) ABSTRACT

Systems and methods are provided to generate a reset signal, such as to facilitate synchronization. In one embodiment, a system to generate a reset signal includes an offset generator that provides an offset clock signal having a frequency offset relative to a frequency of an input clock signal. A reset generator generates the reset signal in response to detecting a periodic phase shift between the offset clock signal and the input clock signal.

19 Claims, 4 Drawing Sheets

SYSTEM AND METHOD FOR GENERATING A RESET SIGNAL FOR SYNCHRONIZATION OF A SIGNAL

TECHNICAL FIELD

The present invention relates generally to a system and method, for generating a reset signal, such as may be utilized for synchronizing a signal to an output.

BACKGROUND

In many types of circuits it is desirable to stabilize, to detect or to synchronize a given signal to a device or to a reference signal. Several techniques have been developed to stabilize a generated signal or to detect signals in the presence of noise. As one example, a closed-loop feedback control system, such as a phase-locked loop (PLL), can be implemented to perform this function. Generally, a PLL generates and outputs a signal in relation to the frequency and phase of an input or reference signal. PLL circuitry can respond to both the frequency and the phase of the input signals, such automatically raising or lowering the frequency of an associated oscillator until the output signal is matched to the reference in both frequency and phase. PLL circuits are widely utilized in radio, telecommunications, computers and other electronic applications.

As a further example, in many communications applications, an eye pattern (also known as an eye diagram) can be generated using an oscilloscope or other display device. The eye pattern is generated based on a digital data signal from a receiver (or other source of data) that is repetitively sampled aid applied to the vertical input, while the data rate is used to trigger the horizontal sweep. The eye pattern receives is name because, for several types of coding, the pattern looks like a series of eyes between a pair of rails.

SUMMARY

The invention relates generally to a system and method generating a sweep reset signal, such as for use in synchronizing a display with an input clock signal. An offset clock is generated with a frequency having a known frequency offset relative to the input clock signal. A reset signal is generated in response to detecting a periodic shift between the offset clock signal and the input clock signal. For example, the periodic shift may correspond to a predetermined fractional or integer multiple of the input clock signal period. The approach can detect the periodic shift between the clock signal using a register (e.g., a D flip flop) having the input clock signal as the input that is clocked by the offset clock. The reset signal that is generated can be used to trigger reset of a sweep generator for locking a desired eye pattern on an associated display.

One aspect of the invention provides a system to generate a reset signal includes an offset generator that provides an offset clock signal having a frequency offset relative to a frequency of an input clock signal. A reset generator generates the reset signal in response to detecting a periodic phase shift between the offset clock signal and the input clock signal.

Another aspect of the invention provides a system for synchronizing an input signal to a device. The system includes means for providing an offset clock signal having a frequency offset relative to the first clock signal by a predetermined amount, the first clock signal being recovered from the input signal. The system also includes means for generating a reset signal in response to detecting a repeatedly occurring phase shift between the offset clock signal and the first clock signal.

The system also includes means for providing a sweep ramp signal according to the reset signal, the sweep ramp signal being utilized to synchronize a representation of the input signal.

Yet another aspect of the invention provides a method for synchronizing a digital input signal for display on a device. The method includes recovering a first clock signal from the digital input signal and generating an offset clock signal having a frequency offset relative to a frequency of the first clock signal by a predetermined amount. A reset signal is generated in response to detecting a repeatedly occurring phase shift between the offset clock signal and the first clock signal. A synchronization signal is generated according to the reset signal, as to synchronize a representation the first clock signal for display at the device.

DETAILED DESCRIPTION

The invention relates generally to a system and method generating a sweep reset signal, such can be utilized for synchronizing a display with a clock signal. In one example embodiment, an offset clock is generated with a frequency having a predetermined frequency offset relative to an input clock signal. A reset signal can be generated in response to detecting a periodic phase shift between the offset clock signal and the input clock signal. The reset signal can be utilized to trigger reset of a sweep generator, such as for locking a desired eye pattern on an associated display. As described herein, the systems and methods can be implemented efficiently without requiring complex circuitry, such as phase-locked loops, which tend to be required in many existing systems.

As will be appreciated by those skilled in the art, certain embodiments of the invention are described herein with reference to flowchart illustrations of methods, systems, and computer program products. It will be understood that blocks of the illustrations, and combinations of blocks in the illustrations, can be implemented by computer-executable instructions. These computer-executable instructions may be provided to one or more processor of a general purpose computer, special purpose computer, or other programmable data processing apparatus (or a combination of devices and circuits) to produce a machine, such that the instructions, which execute via the processor, implement the functions specified in the block or blocks.

These computer-executable instructions may also be stored in computer-readable memory that can direct a computer or other programmable data processing apparatus to function in a particular manner, such that the instructions stored in the computer-readable memory result in an article of manufacture including instructions which implement the function specified in the flowchart block or blocks. The computer program instructions may also fee loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions specified in the flowchart block or blocks.

Figure 1:
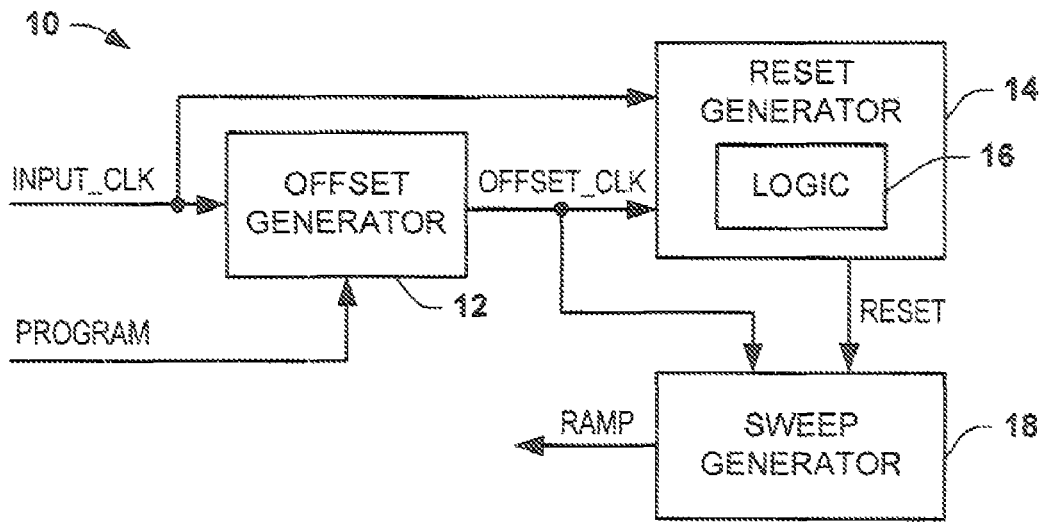
FIG. 1 depicts a block diagram of a system for generating a sweep ramp signal according to an aspect of the invention.

FIG. 1 depicts an example of a system 10 for generating a reset and ramp signal according to an aspect of the invention. The system 10 includes an offset generator 12 that is configured to generate an offset clock signal (OFFSET_CLK) based on an input clock signal (INPUT_CLK). The INPUT_CLK signal can correspond to a clock signal that is recovered from a video input data signal. The OFFSET_CLK and INPUT_CLK each can be provided as signals that oscillate between a high and a low state at a frequency and a duty cycle (e.g., a square wave with a 50% duty cycle or otherwise). Those skilled in the art will understand and appreciate that the INPUT_CLK signal can be recovered from a variety of different type of digital input signals. As one example, the digital input signal from which the INPUT_CLK signal is recovered can correspond to a digital video signal (e.g., the INPUT_CLK signal can correspond to part of digital video signal). The digital video signal can be provided according to any conventional or proprietary format, known or yet to be developed, such as a digital visual interface (DVI), a serial digital interface (SDI) (e.g., standard definition SDI (SD-SDI), high definition SDI (HD-SDI), Dual Link HD-SDI) to name a few.

The offset generator 12 is configured to provide the OFFSET_CLK signal at a frequency that is offset relative to the INPUT_CLK signal by a predetermined amount. The amount of offset between the relative frequencies can be any amount that is a non-integer multiple of the input clock signal. As one example, the OFFSET_CLK signal can be provided at a frequency that is a non-integer multiple of the INPUT_CLK signal ranging from about one-half the frequency to nearly twice the frequency of the input clock signal. The range can be a continuous or discrete range of values to afford a desired range of sampling or subsampling of a representation of the INPUT_CLK signal. The particular amount of offset can vary according to application requirements. Those skilled in the art will understand various types of circuitry that can be employed as means for providing an offset clock signal.

The system 10 includes a reset generator 14 that is configured to generate a RESET signal based on a periodic phase shift between the INPUT_CLK signal and the OFFSET_CLK signal. For instance, the reset generator 14 can detect the periodic phase shift between the INPUT_CLK signal and the OFFSET_CLK signal in response to an edge of the OFFSET_CLK signal being substantially coincident with a state transition of the INPUT_CLK signal, as will occur periodically as the edge scans through the INPUT_CLK signal. That is, because of the relative offset between the frequencies of the clock signals, an edge of the OFFSET_CLK signal will repeatedly scan through the INPUT_CLK signal. For example, the detected periodic phase shift between signals may correspond to a predetermined fractional or integer multiple of the input clock signal period (e.g., periodic shift=n*½T, where n is a positive integer and T denotes the period of the input clock signal). The relative direction of the scan will vary depending upon whether the OFFSET_CLK signal has a frequency that is greater than or less than the INPUT_CLK signal.

The reset generator 14 can include a logic circuitry 16 that is operative to detect the sweeping edge of the OFFSET_CLK signal being coincident with a respective transition in the INPUT_CLK signal. The logic circuitry 16 can also be configured to generate a pulse in response to detecting the state transition. The logic circuitry 16 can include, for example, an arrangement of flip-flops and one or more logic gates arranged for detecting the transition in INPUT_CLK signal and for providing pulse signal as a RESET signal. Those skilled in the art will understand appreciate various types of logic and other circuitry (e.g., analog and digital circuitry) that can be implemented as the reset generator 14 to provide means for generating the RESET signal.

The reset generator 14 can provide the RESET signal to a sweep generator 18. The sweep generator 18 can in turn generate a sweep ramp output signal (RAMP) such as can correspond to an X-coordinate of a graphics display. A corresponding Y-coordinate can be generated, for example, by passing the digital input signal from which the INPUT_CLK signal has been recovered through an analog-to-digital converter (not shown). A series of X and Y coordinates can be provided over time to the display (e.g., by a graphics processor) to render a corresponding eye diagram for the digital input signal. The sweep generator 18, for example, can be implemented as a free running clock that counts over a range of values incremented in response to the OFFSET_CLK signal. The sweep generator 18 can periodically reset to a starting value in response to the RESET signal, such that the RAMP signal provided by the sweep generator 18 can be utilized to lock the digital input signal to the display.

The offset generator 12 can be programmed to implement the desired offset such as is based upon a PROGRAM input signal. As an example, for use in generating an eye diagram, a user can set a number of eyes to be displayed on the associated display. The number of eyes can be utilized to set a corresponding frequency offset value so that the RAMP signal generated (e.g., corresponding to the X coordinate) will scan through a corresponding number of clock periods for the input clock signal. The number of X-coordinates between reset periods varies as a function of the relative frequency offset between the INPUT_CLK signal and the OFFSET_CLK signal. The duration of time that occurs successive periodic phase shifts between the input clock signal and the offset clock signal represents a sampling interval that includes a predetermined number of clock periods of the INPUT_CLK signal. The sampling interval can be employed as a parameter to set the frequency of the OFFSET_CLK for providing a desired number of eyes in the resulting eye diagram.

Figure 2:
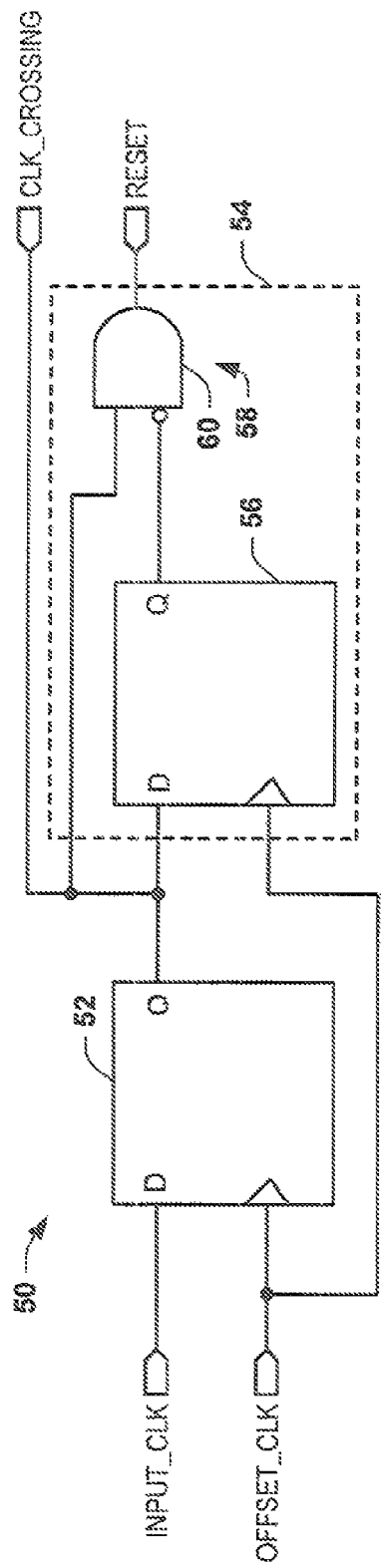
FIG. 2 is a schematic block diagram of a system for generating a sweep reset according to an aspect of the invention.

FIG. 2 depicts an example of a system 50 that can be implemented by logic circuitry for generating a RESET signal according to an aspect of the invention. The system 50 includes a first logic circuit, such as can be implemented as a flip-flop 52 (e.g., a D flip-flop), for capturing a state transition of the first clock signal that is substantially coincident with an edge of the offset clock signal. The OFFSET_CLK signal is provided at a clock (or enable) input of the flip-flop 52. As described herein, the OFFSET_CLK signal is provided with a predetermined frequency offset relative to an INPUT_CLK signal. The INPUT_CLK signal is provided as the data input of the flip-flop 52. As a result, the state of the INPUT_CLK signal will be captured and provided at the Q output thereof according to the OFFSET_CLK signal provided at the clock input. The Q output of the flip-flop 52 corresponds to a clock crossing-signal (CLK_CROSSING). As an example, the D flip-flop 52 can be implemented as an edge-triggered (e.g., rising edge or falling edge) flip-flop or a level-triggered flip-flop for capturing the INPUT_CLK signal provided at the D input thereof. How the sample being captured can vary according to the type of the flip-flop 52 being utilized.

As an example, the Q output of the flip-flop 52 corresponds to a transition signal that changes states in response to the rising edge (or falling edge) of the clock offset signal being substantially coincident with a state transition in the INPUT_CLK signal. That is, as the rising edge (or falling edge) of the OFFSET_CLK is aligned with a first state of the INPUT_CLK during one clock signal and then aligned with the opposing state in the next signal the CLK_CROSSING signal will change its state accordingly. The CLK_CROSSING signal thus can represent each detected state transition that is coincident with the edge of the OFFSET_CLK signal. The CLK_CROSSING signal will remain in such state until another state transition is captured by the flip-flop 52.

The OFFSET_CLK is also provided to pulse generator 54 for generating the RESET signal in response to detecting a given transition at the CLK_CROSSING signal. In the example of FIG. 2, the pulse generator 54 includes a flip-flop 56 and digital logic 58 arranged for generating the RESET signal. The flip-flop 56 receives the OFFSET_CLK at a clock input and the Q output of the flip-flop 52 at a data input thereof. In the example of FIG. 2, the logic is being implemented as an AND-gate 60, although those skilled in the art will understand other types and configurations of logic that may be implemented according to system requirements. The Q output of the flip-flop 56 is provided into an inverting input of the AND-gate 60. The output of the first flip-flop 52 (the CLK_CROSSING signal) is provided to another input of the AND-gate 60. The AND-gate 60 thus ands the inverted output of the flip-flop 56 with the CLK_CROSSING signal to generate the RESET signal as a pulse. Those skilled in the art will understand and appreciate other circuitry that can be utilized for generating a corresponding pulse. For example, other edges can be utilized to generate the RESET signal and different pulse widths can be provided using different circuitry.

Figure 3:
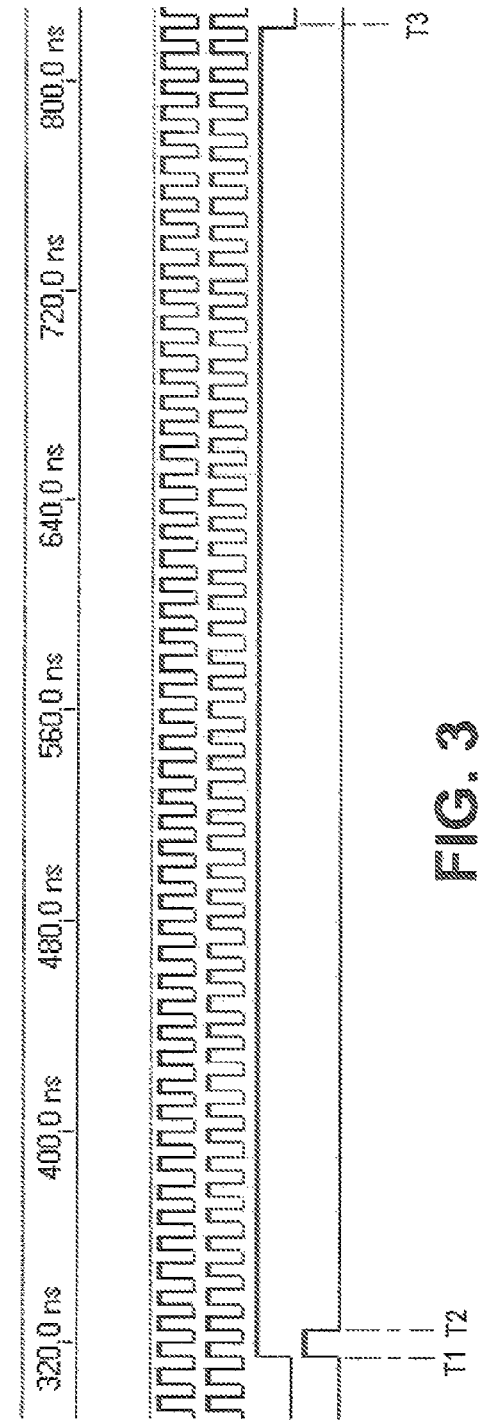
FIG. 3 depicts a timing diagram for signals in the system of FIG. 2.

FIG. 3 is a timing diagram for signals from the system 50 of FIG. 2. In FIG. 3 it is shown that the OFFSET_CLK has a frequency that is slightly less (e.g., a clock cycle period of the OFFSET_CLK signal is slightly larger) than the INPUT_CLK signal. As a result, the rising edge of the OFFSET_CLK signal scans across the INPUT_CLK signal for sub sampling the INPUT_CLK signal in the example of FIG. 3, the rising edge of OFFSET_CLK signal, having a lower frequency than the INPUT_CLK signal, appears to scan through the INPUT_CLK signal from the left to the right side of the INPUT_CLK signal. Alternatively, the OFFSET_CLK signal could have a frequency that is greater than the INPUT_CLK signal such that the scanning would appear to occur in the opposite direction from the orientation shown in the example of FIG. 3.

As shown in FIG. 3, the CLK_CROSSING signal goes high at a time indicated at T1 in response to the rising edge of the OFFSET_CLK signal being substantially coincident with a state transition of the INPUT_CLK signal from low to high. The RESET signal also is provided as a pulse from T1 to T2 to identify the detected periodic phase shift between the INPUT_CLK signal and the OFFSET_CLK signal. The CLK_CROSSING signal stays high until time T3, in which the rising edge of the OFFSET_CLK is substantially coincident with the transition from high to low of the INPUT_CLK signal. It is apparent that no RESET signal is asserted at T3 since the pulse generator 54 in FIG. 2 is configured to generate the RESET signal in response to the rising edge of the OFFSET_CLK being substantially coincident with a low to high transition in the INPUT_CLK signal. Those skilled in the art will understand and appreciate the pulse generated could be configured to generate pulses. In situations that are different from those described herein.

Figure 4:
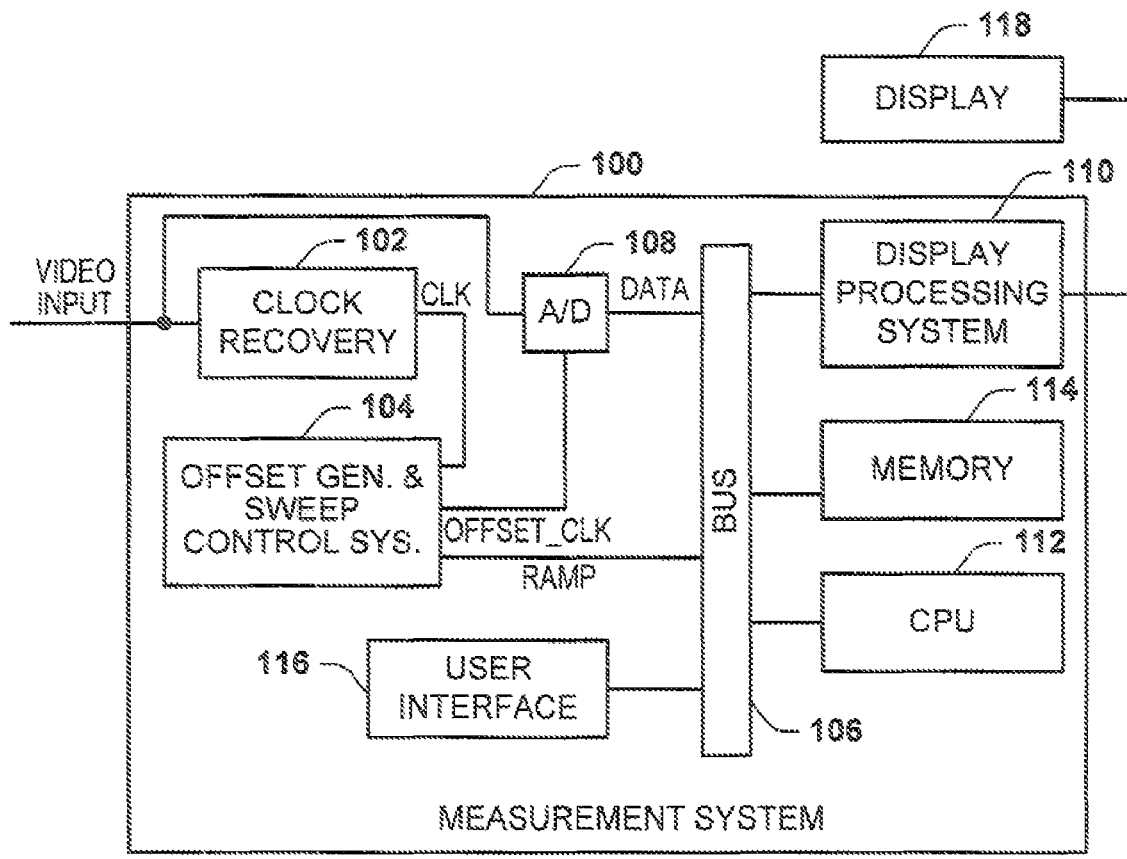
FIG. 4 depicts a block diagram of a measurement system implementing a system according to an aspect of the invention.

FIG. 4 depicts an example of the measurement system 100 that can implement an offset generator and sweep control system, such as shown and described herein. The measurement system 100 includes a clock recovery circuit 102 that receives a video input signal, such as a digital video signal having a known or yet-to-be-developed format. The clock recovery circuit 102 provides a corresponding clock signal (CLK) recovered from the video input. The clock signal CLK is provided to an offset generator and sweep control system 104. The offset generator and sweep control system 104, for example, can correspond to the system 10 shown and described with respect to FIG. 1.

As described herein, the offset generator and sweep control system 104 can generate an offset clock having a predetermined frequency offset relative to the clock signal provided by the clock recovery circuit 102. A reset signal can be generated in response to detecting a periodic phase shift between the CLK signal and the OFFSET_CLK signal, such as described herein. The offset generator and sweep control system 104 in turn can generate a periodic RAMP signal that is provided to a bus 106. The bus 106 can be implemented as an electrical connection, backplane or any subsystem configured to transfer data and/or power within the measurement system 100. Those skilled in the art will understand and appreciate various bus architectures, backplanes, point-to-point connections and associated protocols that can be utilized to provide the bus 106.

The video input signal can also be provided to analog-to-digital (A/D) converter 108 that can be configured as means for converting the input signal to a corresponding digital DATA signal. The converter 108 thus can provide the DATA signal to the bus 106. By way of example, the RAMP signal can correspond to an X-coordinate of a graphical display and the DATA signal can correspond to a Y-coordinate. The DATA and RAMP signals can thus be propagated over the bus 106 to a display processing system 110. For instance, each of the DATA and RAMP signals can be synchronously provided over the bus 106 according to the OFFSET_CLK signal.

The display processing system 110 can illuminate pixels on an associated display 118 according to the X and Y coordinates defined by the DATA and RAMP signals, which can generate a corresponding graphical pattern on the display. The display processing system 110 can render the graphical pattern, for example, as a substantially stationary eye pattern, that is locked to the associated display 118. Those skilled in the art will understand and appreciate various types and arrangements of circuitry that can be utilized to implement the display processing system 110 and/or the display as means for displaying a graphical representation of the DATA signal. Those skilled in the art will further understand and appreciate various types of display devices that can be utilized for displaying the pattern. The display processing system 110 thus may be configured to provide the output according to any one or more video output formats (e.g., VGA, DVI, etc.).

The measurement system 100 also can include a central processing unit (CPU) 112 and memory 114. The memory 114 can include various types and configurations of memory, including a combination of one or more types of volatile and non-volatile memory. The CPU 112 can execute instructions stored in the memory 114 for controlling various features and functionality implemented by the measurement system 100. As one example, the measurement system 100 may employ a user interface 116 that can utilize executable instructions for programming one or more features of the offset generator and sweep control system 104.

The user interface 116 can be a man-machine interface, such as an on-screen display (e.g., including text and/or graphical elements) or other controls, that can be utilized by a person to enter data and program instructions into the measurement system 100. The program instructions and data can be stored in the memory 114. For example, the user interface 116 can be employed to display parameters, which may vary as a function of the OFFSET_CLK signal. As one example, the user interface 116 can be utilized to set a number of eye diagrams for display on an associated display 118. The number of eye diagrams can be configured by varying the relative frequency offset between the clock signal and the OFFSET_CLK signal being generated. Thus, the user interface 116 can cooperate with the CPU 112 and memory 114 to provide means for programming the predetermined amount of the frequency offset.

Figure 5:
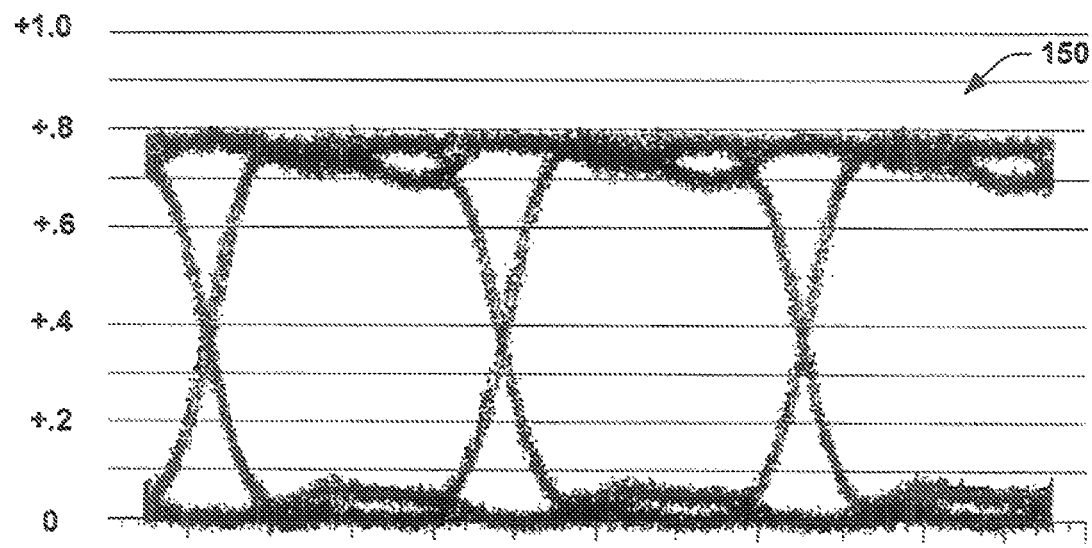
FIG. 5 depicts an example of an eye diagram that can be generated and locked to a display according to an aspect of the invention.
Figure 6:
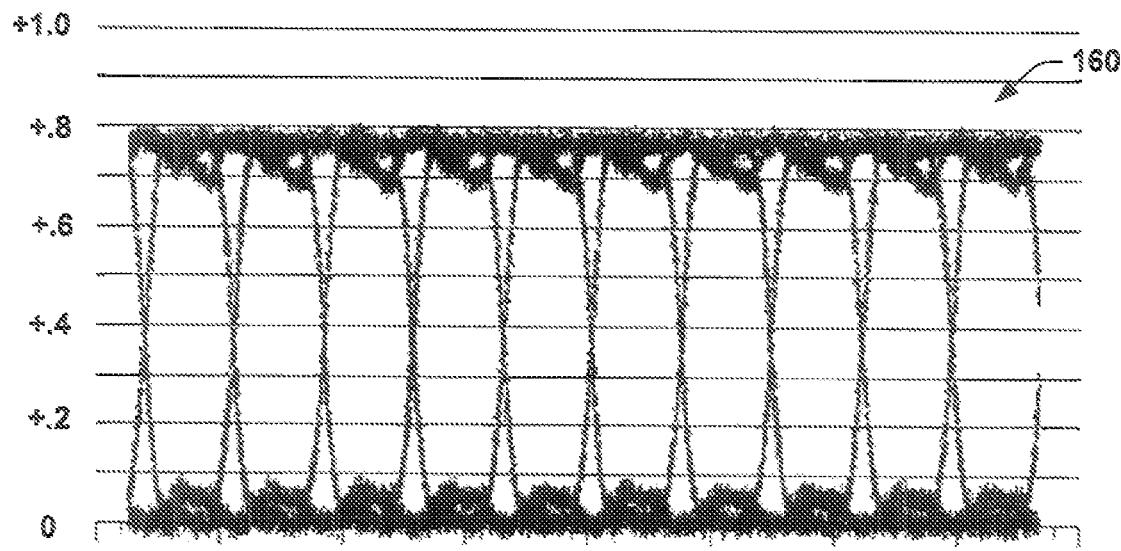
FIG. 6 depicts another example of an eye diagram that can be generated and locked to a display according to an aspect of the invention.

FIGS. 5 and 6 depict two examples of eye diagrams 150 and 160 that can be generated on the associated display 118. In the example of FIG. 5, the eye diagram 150 includes three eyes that are locked to the display based on the RAMP signal generated by the offset generator and sweep control system 104 and the DATA signal from the A/D converter 108. In FIG. 6, the eye diagram 160 includes ten eyes that are locked to the display based on the reset signal and corresponding RAMP signal provided by the offset generator and sweep control system 104 (FIG. 4). Those skilled in the art will understand and appreciate that other number of eyes can be provided based upon appropriate instructions being entered such as through the user interface 116.

Figure 7:
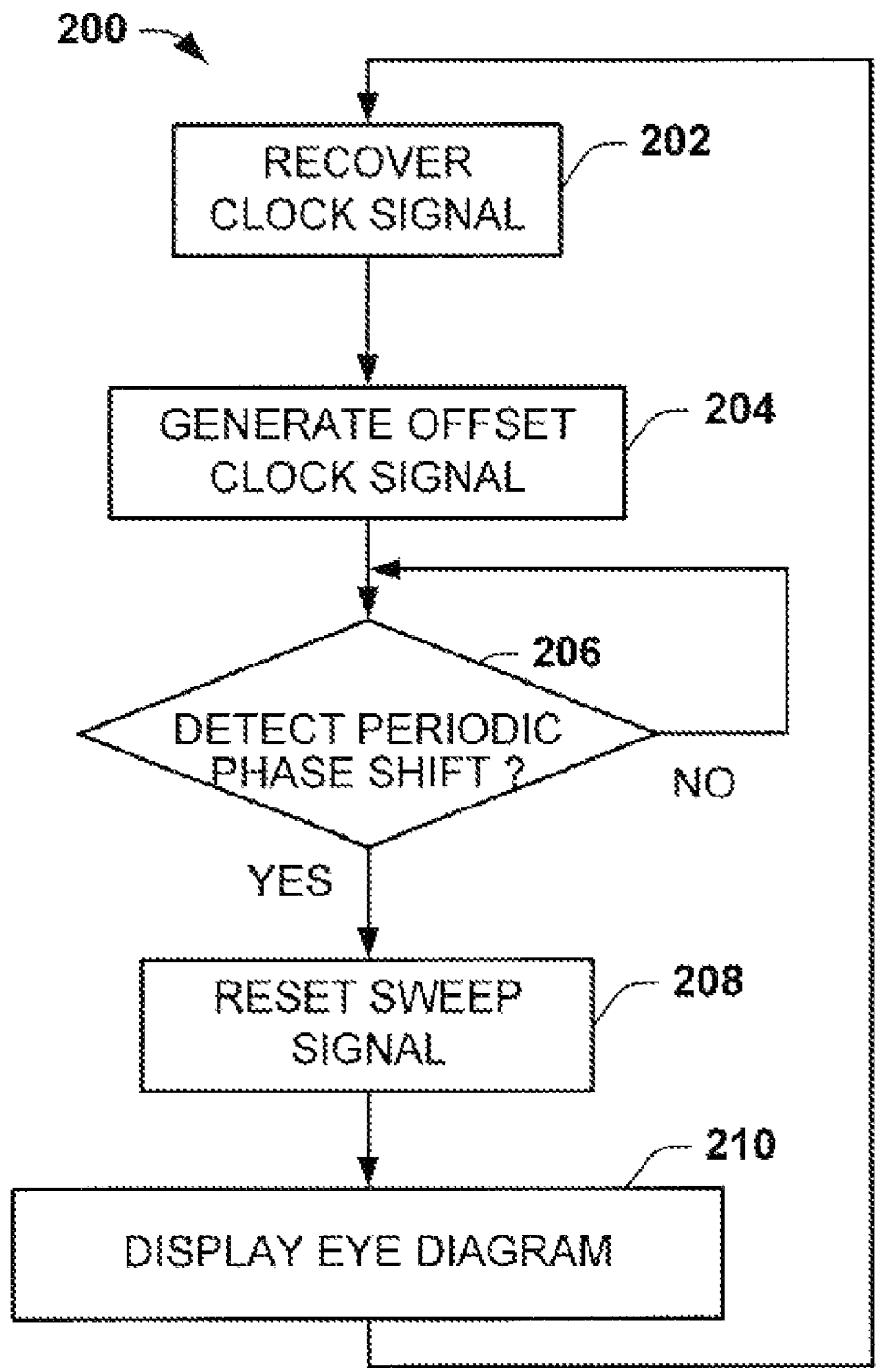
FIG. 7 is a flow diagram depicting a method for generating a ramp signal for locking an input to a display according to an aspect of the invention.

In view of the structural and functional features described above, certain methods will be better appreciated with reference to FIG. 7. It is to be understood and appreciated that the illustrated actions, in other embodiments, may occur in different orders or concurrently with other actions. Moreover, not all features illustrated in FIG. 7 may be required to implement a method according to the subject invention. It is to be further understood that the following methodology can be implemented in hardware (e.g., in logic circuitry, in one or more processors or controllers, such as in a computer specially configured test equipment), software (e.g., stored in a computer readable medium or as executable instructions running on one or more processors), or as a combination of hardware and software.

FIG. 7 is a flow diagram depicting an example of a method that can be utilized for generating a RAMP signal and displaying an eye diagram according to an aspect of the invention. The method 200 starts at 202 in which the clock signal is recovered. The clock signal can be recovered, for example, from a digital input, such as received from source of digital video data. At 204 art OFFSET_CLK signal is generated. The OFFSET_CLK signal can be generated with a predetermined frequency offset relative to a frequency of the recovered clock signal at 202. The amount of frequency offset can be programmable such as to set parameters for displaying a predetermined number of eyes in an eye pattern.

At 206, a determination is made as to whether a periodic phase shift has been detected. If a periodic phase shift has not been detected (NO), the method can loop at 206. Concurrent with the loop, a RAMP signal can incrementally ramp up according to the OFFSET_CLK signal generated at 204. If a periodic phase shift has been detected (YES), the method proceeds to 208. At 208, the sweep signal is reset in response to detecting the periodic phase shift. As described herein, for example, the periodic phase shift can be detected in response to a predefined edge of the OFFSET_CLK signal being substantially coincident with a state transition in the recovered clock signal, such as may occur repeatedly at a predetermined multiple of the input clock signal period.

At 210, the eye diagram is displayed. The display of the eye diagram will vary according to the RAMP sweep signal that is generated and the input signal (e.g., a digital video signal) that is provided to an analog-digital converter. That is, the RAMP signal can correspond to an x-coordinate and the output of the analog-to-digital converter can correspond to a y-coordinate of a display. Because the sweep signal is reset periodically according to the periodic, phase shift, between the OFFSET_CLK signal and the recovered clock signal, the coordinates of the eye diagram are rendered to the display and locked to the display in a substantially fixed orientation. In this way, the eye diagram will appear stationary to a viewer such that appropriate analysis (e.g., jitter analysis or other tests) can be performed on the input signal.

What have been described above are examples and embodiments of the invention. It is, of course, not possible to describe every conceivable combination of components or methodologies for purposes of describing the invention, but one of ordinary skill in the art will recognize that many further combinations and permutations of the present invention are possible. Accordingly, the invention is intended to embrace all such alterations, modifications and variations that fall within the scope of the appended claims. In the claims, unless otherwise indicated, the article "a" is to refer to "one or more than one."

What is claimed is:

1. A system to generate a reset signal, comprising:
   an offset generator that provides an offset clock signal having a frequency offset relative to a frequency of an input clock signal; and
   a reset generator that generates the reset signal in response to detecting a periodic phase shift between the offset clock signal and the input clock signal;
   wherein a number of input clock signal cycle periods that occur between a pair of adjacent periodic phase shifts varies as a function of the frequency offset between the offset clock signal and the input clock signal.

2. The system of claim 1, further comprising a sweep generator that provides a sweep ramp signal that increments based on the offset clock signal and that is reset periodically in response to the reset signal.

3. The system of claim 2, further comprising an analog-to-digital converter that converts a digital input signal to a corresponding digital data signal, wherein the sweep ramp signal defines an x-coordinate and the digital data signal defines a y-coordinate of a two-dimensional graphical display, the sweep ramp signal being utilized to synchronize the digital data signal on the two-dimensional graphical display.

4. The system of claim 3, wherein the digital input signal comprises a digital video signal from which the input clock signal is recovered, the two-dimensional graphical display corresponding to an eye diagram.

5. The system of claim 1, wherein the reset generator repeatedly detects the periodic phase shift in response to an edge of the offset clock signal being substantially coincident with a state transition of the input clock signal as the edge scans though the input clock signal.

6. The system of claim 1, wherein the frequency offset is a fractional or non-integer multiple of the input clock signal.

7. The system of claim 1, wherein the frequency of the offset clock signal is set to be in a range from about one-half to about two-times the frequency of the input clock signal.

8. The system of claim 1, wherein the frequency offset is programmable.

9. The system of claim 1, wherein a duration of time that occurs between each periodic phase shift between the input clock signal and the offset clock signal represents a sampling interval of the input clock signal that includes a predetermined number of clock periods of the input clock signal.

10. The system of claim 1, wherein the reset generator further comprises at least one flip-flop, the at least one flip-flop being clocked by the offset clock signal for capturing a state of the input clock signal at an output of the at least one flip-flop.

11. The system of claim 10, wherein the reset generator further comprises logic configured to generate the reset signal as a pulse that occurs in response to detecting a predetermined transition at the output of the at least one flip-flop.

12. A system for synchronizing an input signal to a device, comprising:
means for providing an offset clock signal having a frequency offset relative to a first clock signal by a predetermined amount, the first clock signal being recovered from the input signal;
means for generating a reset signal in response to detecting a repeatedly occurring phase shift between the offset clock signal and the first clock signal, wherein a number of first clock signal cycle periods that occur between a pair of adjacent periodic phase shifts varies as a function of the frequency offset between the offset clock signal and the input clock signal; and
means for providing a sweep ramp signal according to the reset signal, the sweep ramp signal being utilized to synchronize a representation of the input signal.

13. The system of claim 12, further comprising means for converting the input signal to a corresponding digital data signal, wherein the sweep ramp signal defines an x-coordinate and the corresponding digital data signal defines a y-coordinate of a two-dimensional graphical display.

14. The system of claim 13, further comprising means for displaying a graphical representation of the corresponding digital data signal, the sweep ramp signal being utilized to synchronize the corresponding digital input signal for display on the means for displaying.

15. The system of claim 12, further comprising means for capturing a state transition of the first clock signal that is substantially coincident with an edge of the offset clock signal and for providing a transition signal to indicate each state transition.

16. The system of claim 15, wherein the means for capturing further comprises logic circuitry having a clock input driven by the offset clock signal.

17. The system of claim 12, wherein a number of clock cycle periods that occur between a pair of adjacent periodic phase shifts varies as a function of the predetermined amount of the frequency offset.

18. The system of claim 15, further comprising means for programming the predetermined amount of the frequency offset.

19. A method for synchronizing a digital input signal for display on a device, comprising:
recovering a first clock signal from the digital input signal;
generating an offset clock signal having a frequency offset relative to a frequency of the first clock signal by a predetermined amount;
generating a reset signal in response to detecting a repeatedly occurring phase shift between the offset clock signal and the first clock signal in response to an edge of the offset clock signal being substantially coincident with a state transition of the first clock signal as the edge scans though the first clock signal; and
generating a synchronization signal according to the reset signal, the synchronization signal being utilized to synchronize a representation the digital input signal for display at the device.

* * * * *